(12) United States Patent
Moon et al.

(10) Patent No.: US 10,304,664 B2
(45) Date of Patent: May 28, 2019

(54) SYSTEMS AND METHODS OF TREATING A SUBSTRATE

(71) Applicant: Semes Co., Ltd, Cheonan-si, Chungcheongnam-do (KR)

(72) Inventors: Hyungchul Moon, Cheonan-si (KR); Hyung Joon Kim, Pyeongtaek-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 15/788,166

(22) Filed: Oct. 19, 2017

(65) Prior Publication Data
US 2018/0040458 A1 Feb. 8, 2018

Related U.S. Application Data

(62) Division of application No. 14/862,748, filed on Sep. 23, 2015.

(30) Foreign Application Priority Data

Sep. 30, 2014 (KR) ........................ 10-2014-0131914

(51) Int. Cl.
*H01J 37/32* (2006.01)
*H01L 21/3065* (2006.01)
*H01L 21/3213* (2006.01)
*H01L 21/67* (2006.01)

(52) U.S. Cl.
CPC .... *H01J 37/3244* (2013.01); *H01J 37/32009* (2013.01); *H01J 37/32449* (2013.01); *H01J 37/32477* (2013.01); *H01J 37/32642* (2013.01); *H01J 37/32715* (2013.01); *H01J 37/32862* (2013.01); *H01J 37/32871* (2013.01); *H01L 21/3065* (2013.01); *H01L 21/32136* (2013.01); *H01L 21/67069* (2013.01)

(58) Field of Classification Search
None
See application file for complete search history.

(56) References Cited

U.S. PATENT DOCUMENTS

| 6,527,911 | B1 | 3/2003 | Yen et al. |
| 2001/0042514 | A1 | 11/2001 | Mizuno et al. |
| 2002/0076507 | A1 | 6/2002 | Chiang et al. |
| 2002/0139478 | A1 | 10/2002 | Ma et al. |

(Continued)

FOREIGN PATENT DOCUMENTS

| CN | 101179045 A | 5/2008 |
| CN | 101383272 A | 3/2009 |

(Continued)

*Primary Examiner* — Jiong-Ping Lu
(74) *Attorney, Agent, or Firm* — Harness, Dickey & Pierce, P.L.C.

(57) ABSTRACT

Substrate treating systems are disclosed. The system may include a chamber with a processing space, a supporting unit provided in the processing space to support a substrate, a gas supplying unit provided in the processing space to supply gas into the processing space, a plasma source unit generating plasma from the gas, and a liner unit disposed to enclose the supporting unit. The supporting unit may include a supporting plate supporting a substrate. The liner unit may include an inner liner enclosing the supporting plate and an actuator vertically moving the inner liner.

8 Claims, 8 Drawing Sheets

(56) References Cited

U.S. PATENT DOCUMENTS

| | | |
|---|---|---|
| 2005/0056217 A1 | 3/2005 | Yamada et al. |
| 2005/0070105 A1 | 3/2005 | Bailey et al. |
| 2011/0049100 A1 | 3/2011 | Han et al. |
| 2011/0061810 A1 | 3/2011 | Ganguly et al. |
| 2011/0061813 A1* | 3/2011 | Iizuka ............... H01J 37/32091 156/345.34 |
| 2012/0028379 A1 | 2/2012 | Dhindsa et al. |
| 2013/0000558 A1 | 1/2013 | Hara et al. |

FOREIGN PATENT DOCUMENTS

| | | |
|---|---|---|
| CN | 101447394 A | 6/2009 |
| CN | 101609790 A | 12/2009 |
| CN | 102738048 A | 10/2012 |
| CN | 102931056 A | 2/2013 |
| CN | 103377979 A | 10/2013 |
| KR | 100797424 B1 | 1/2008 |
| KR | 1020120079961 A | 7/2012 |
| KR | 101197992 B1 | 11/2012 |
| KR | 1020140052899 A | 5/2014 |
| KR | 101437522 B1 | 9/2014 |
| KR | 101490628 B1 | 2/2015 |

* cited by examiner

SYSTEMS AND METHODS OF TREATING A SUBSTRATE

CROSS-REFERENCE TO RELATED APPLICATIONS

This U.S. non-provisional patent application is a divisional of U.S. application Ser. No. 14/862,748, filed on Sep. 23, 2015, which claims priority under 35 U.S.C. § 119 to Korean Patent Application No. 10-2014-0131914, filed on Sep. 30, 2014, in the Korean Intellectual Property Office, the entire contents of each of which are hereby incorporated by reference.

BACKGROUND OF THE INVENTION

Example embodiments of the inventive concept relate to systems and methods of treating a substrate, and in particular, to systems and methods of treating a substrate using plasma.

Gas is ionized under high temperature environment, strong electric field, or a radio frequency (RF) electromagnetic field to form plasma including ions, electrons, and radicals. A process of fabricating a semiconductor device includes a plasma etching step. For example, a substrate or a layer formed on the substrate is etched through physical collision or chemical reaction with ionic particles contained plasma.

The etching process is performed in a process chamber. In detail, plasma is generated by supplying a process gas into a process chamber and then applying RF power to the process chamber to excite the process gas. Here, the process gas is supplied into the process chamber through center or side nozzles respectively provided at a center region of a top cover of the process chamber and at a sidewall of the process chamber. The process gas supplied through the center nozzle is mainly used to etch a center region of a substrate, whereas the process gas supplied through the side nozzle is mainly used to etch an edge region of the substrate. However, an exhaust port is provided between the process chamber and a supporting plate for supporting the substrate, and thus, a sizable amount of the process gas supplied through the side nozzle is not supplied to the edge region of the substrate and is discharged to the outside through the exhaust port; that is, there may be a great loss of the supplied process gas.

In addition, various side rings enclosing the supporting plate are provided in a substrate treating system. However, by-products may be produced in a substrate treating process and may be piled in a space between the supporting plate and the side ring. The by-products may serve as particles, causing process failures in a subsequent substrate treating process.

SUMMARY

Example embodiments of the inventive concept provide a plasma-based substrate treating system with high process efficiency and a method of treating a substrate using the same.

Other example embodiments of the inventive concept provide a plasma-based substrate treating system capable of reducing loss of a process gas to be supplied therein and a method of treating a substrate using the same.

Still other example embodiments of the inventive concept provide a plasma-based substrate treating system capable of reducing a spatial variation in an amount of a process gas supplied onto a substrate and a method of treating a substrate using the same.

Even still other example embodiments of the inventive concept provide a plasma-based substrate treating system configured to effectively remove by-products from a space between a supporting plate and a side ring and a method of treating a substrate using the same.

According to example embodiments of the inventive concept, a substrate treating system may include a chamber with a processing space, a supporting unit provided in the processing space to support a substrate, a gas supplying unit provided in the processing space to supply gas into the processing space, a plasma source unit generating plasma from the gas, and a liner unit disposed to enclose the supporting unit. The supporting unit may include a supporting plate supporting a substrate. The liner unit may include an inner liner enclosing the supporting plate and an actuator vertically moving the inner liner.

In some embodiments, the gas supplying unit may include a main nozzle coupled to a wall of the chamber to supply the gas into the processing space, and an auxiliary nozzle provided on the inner liner to supply the gas into the processing space.

In some embodiments, the liner unit may further include an outer liner provided in the chamber and shaped like a ring.

In some embodiments, the supporting unit may further include a focus ring provided to enclose the supporting plate and have a circular shape, and the inner liner may be provided to enclose the focus ring.

In some embodiments, the gas may include a process gas and the gas supplying unit may further include an auxiliary process gas line supplying the process gas to the auxiliary nozzle.

In some embodiments, the gas may include a cleaning gas and the gas supplying unit may further include an auxiliary cleaning gas line supplying the cleaning gas to the auxiliary nozzle.

In some embodiments, the gas may include a process gas and a cleaning gas. The gas supplying unit may include an auxiliary process gas line supplying the process gas to the auxiliary nozzle, and an auxiliary cleaning gas line supplying the cleaning gas to the auxiliary nozzle.

In some embodiments, the inner liner may be provided to have a circular-ring shape, and the inner liner may include a plurality of penetration holes formed through the inner liner along a circumference thereof to connect an internal space of the inner liner to an outer space.

In some embodiments, the penetration holes may be positioned below the auxiliary nozzle.

In some embodiments, the liner unit may further include a controller controlling the actuator, and the controller may control the actuator in such a way that a vertical position of the inner liner is changed depending on a state of a substrate treating process.

In some embodiments, the controller may control the actuator in such a way that the inner liner is positioned at a first position in a processing step of supplying the process gas into the chamber to treat the substrate and is positioned at a second position lower than the first position in a waiting step before loading the substrate into the chamber.

In some embodiments, the controller may control the actuator in such a way that the inner liner is positioned at a third position lower than the first position and higher than the second position, in a cleaning step of supplying the cleaning gas into the chamber to remove by-products from a space between the supporting plate and the focus ring.

In some embodiments, the first position may be higher than a top surface of the supporting unit.

In some embodiments, the second position may be lower than a top surface of the supporting unit.

In some embodiments, the third position may be higher than the top surface of the supporting unit.

In some embodiments, the auxiliary nozzle may be provided through the inner liner to directly supply the cleaning gas into a space between the focus ring and the supporting plate.

In some embodiments, the auxiliary nozzle may be provided through the inner liner in such a way to allow the cleaning gas to be supplied in a direction parallel to a top surface of the supporting plate.

According to example embodiments of the inventive concept, a method of treating a substrate may include a processing step of supplying a process gas into a processing space of a chamber to treat a substrate loaded on a supporting plate, and a waiting step of waiting for loading of the substrate in the processing space of the chamber. An inner liner provided to enclose the supporting plate may be positioned at a first position in the processing step and at a second position lower than the first position in the waiting step.

In some embodiments, the method may further include a cleaning step for removing by-products from a space between a focus ring enclosing the supporting plate and the supporting plate, between the processing step and the waiting step. In the cleaning step, the inner liner may be positioned at a third position lower than the first position and higher than the second position.

In some embodiments, in the processing step, the process gas may be supplied to a main nozzle provided through a wall of the chamber and to an auxiliary nozzle provided through the inner liner.

In some embodiments, in the processing step, amounts of the process gas supplied to the main nozzle and the auxiliary nozzle may be substantially the same.

In some embodiments, in the cleaning step, the cleaning gas may be supplied to an auxiliary nozzle provided through the inner liner.

In some embodiments, the first position may be higher than a top surface of the substrate loaded on the supporting plate.

In some embodiments, the second position may be lower than a top surface of the substrate loaded on the supporting plate.

In some embodiments, the third position may be higher than the top surface of the substrate loaded on the supporting plate.

In some embodiments, the inner liner may be provided to have a circular-ring shape and to include a plurality of penetration holes formed through the inner liner along a circumference thereof to connect an internal space of the inner liner to an outer space. In the first position, the penetration holes may be positioned at a level higher than a top surface of the substrate loaded on the supporting plate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
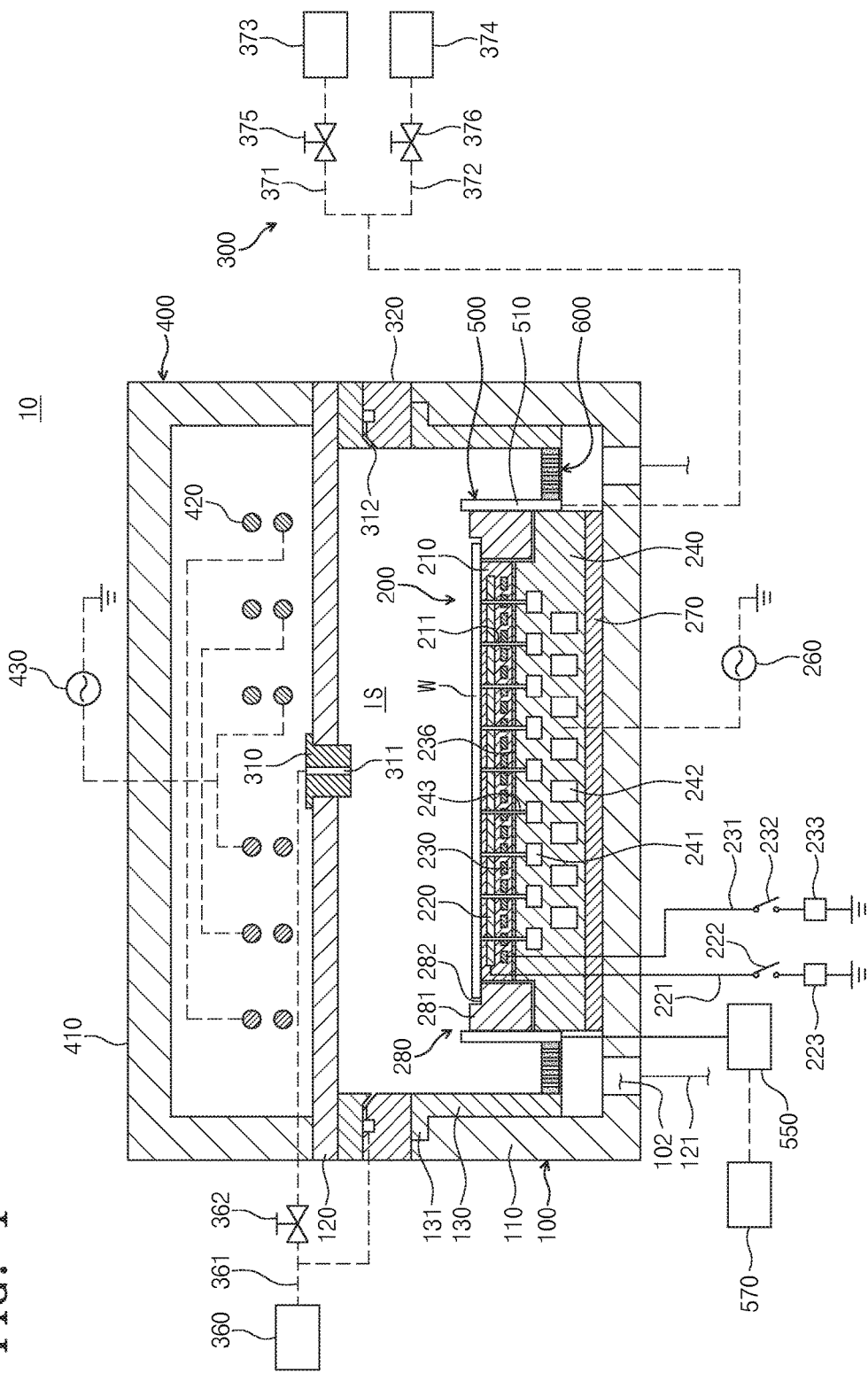
FIG. 1 is a sectional view illustrating a substrate treating system according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
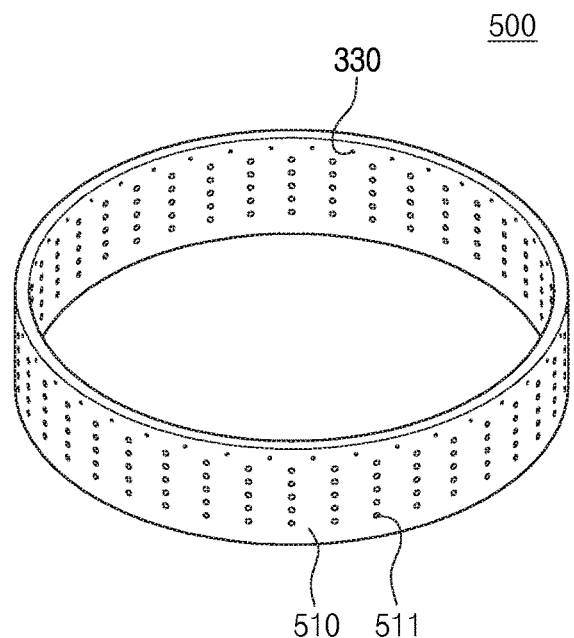
FIGS. 2 and 3 are perspective views illustrating an inner liner of FIG. 1.
Figure 3:
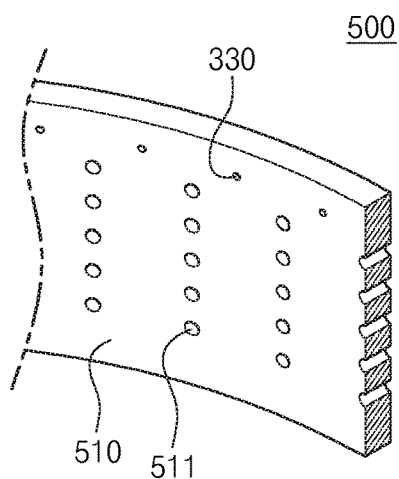
Figure 4:
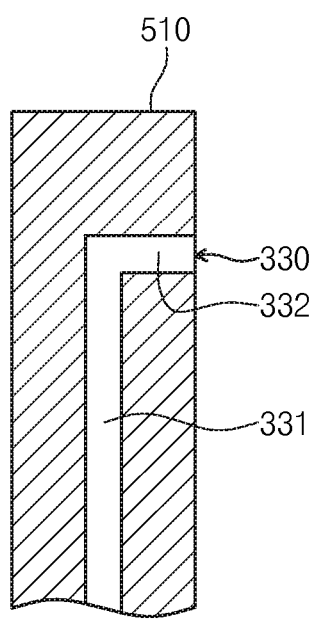
FIG. 4 is a sectional view of an auxiliary nozzle provided in an inner liner of FIG. 1.

FIG. 1 is a sectional view illustrating a substrate treating system according to example embodiments of the inventive concept, FIGS. 2 and 3 are perspective views illustrating an inner liner of FIG. 1, and FIG. 4 is a sectional view of an auxiliary nozzle provided in an inner liner of FIG. 1. Referring to FIGS. 1 through 4, a substrate treating system 10 may be configured to treat a substrate or wafer W using plasma. The substrate treating system 10 may include a chamber 100, a supporting unit 200, a gas supplying unit 300, a plasma source unit 400, a liner unit 500, and a baffle unit 600.

The chamber 100 may be configured to define a top open space. The chamber 100 may provide a processing space, in which a substrate treating process will be performed. The chamber 100 may include a body 110 and a window 120.

The body 110 may be provided to define a top open internal space therein. The internal space of the body 110 may be used as a space for the substrate treating process. The body 110 may be formed of a metallic material. For example, the body 110 may be formed of an aluminum-containing material. The body 110 may be grounded. An exhausting hole 102 may be formed through a bottom surface of the body 110. The exhausting hole 102 may be used as a path for exhausting by-products produced in the substrate treating process and a process gas remaining in the body 110 to the outside of the body 110.

The window 120 may be provided on the body 110 to cover the open top of the body 110. The window 120 may be provided to have a plate-shaped structure and to seal the internal space of the body 110. The window 120 may be formed of or include a dielectric material.

The supporting unit 200 may be positioned in the body 110. The supporting unit 200 may be configured to support the substrate W. The supporting unit 200 may include an electrostatic chuck configured to hold the substrate W using an electrostatic force. Alternatively, the supporting unit 200 may be configured to hold the substrate W using other ways such as a mechanical clamping. For the sake of simplicity, the description that follows will refer to an example of the present embodiment in which an electrostatic chuck is used as the supporting unit 200.

The electrostatic chuck 200 may include a supporting plate 210, a lower electrode 220, a heater 230, a lower plate 240, a lower power 260, an insulating plate 270, and a focus ring 280.

The supporting plate 210 may be used as an upper part of the electrostatic chuck 200. The supporting plate 210 may be shaped like a circular disk and may be formed of a dielectric material. The substrate W may be loaded on a top surface of the supporting plate 210. The top surface of the supporting plate 210 may have a radius smaller than that of the substrate W. Accordingly, if the substrate W is loaded on the supporting plate 210, an edge region of the substrate W may be positioned outside the supporting plate 210.

The lower electrode 220 and the heater 230 may be buried in the supporting plate 210. The lower electrode 220 may be positioned on the heater 230. The lower electrode 220 may be electrically connected to a first power supply 223. The first power supply 223 may be configured to supply a DC power, allowing for the electrostatic chuck 200 to fasten the substrate W. A switch 222 may be installed between the lower electrode 220 and the first power supply 223. The lower electrode 220 may be electrically connected to the first power supply 223, depending on an on/off state of the switch 222. For example, in the case where the switch 222 is in an on state, a DC current may be applied to the lower electrode 220. A current applied to the lower electrode 220 may make it possible for the lower electrode 220 to exert an electrostatic force to the substrate W, and thus, the substrate W may be fastened on the supporting plate 210.

The heater 230 may be electrically connected to a second power supply 233. In the heater 230, the electric current supplied from the second power supply 233 may be converted to heat energy. The heat energy may be transmitted to the substrate W through the supporting plate 210. For example, the heat energy generated in the heater 230 may allow for the substrate W to be heated to a specific temperature. The heater 230 may be provided in the form of a coil-shaped heating wire. In some embodiments, a plurality of heaters 230 may be provided in the supporting plate 210.

The lower plate 240 may be positioned below the supporting plate 210. A bottom surface of the supporting plate 210 may be attached to a top surface of the lower plate 240 by an adhesive layer 236. The lower plate 240 may be formed of an aluminum-containing material. The top surface of the lower plate 240 may be higher at a center region thereof than at an edge region thereof, thereby having staircase structure. The center region of the top surface of the lower plate 240 may have substantially the same or similar area as that of the bottom surface of the supporting plate 210 and may be adhered to the bottom surface of the supporting plate 210.

The lower plate 240 may be provided to have at least one path for circulating a heat transfer medium. For example, the heat transfer medium may contain an inert gas (e.g., helium gas). In some embodiments, the lower plate 240 may be configured in such a way that a pathway can be circulated therein. For example, the lower plate 240 may be provided to have a second circulation conduit 242, through which the coolant for cooling the lower plate 240 is circulated. The cooling of the lower plate 240 may be performed in such a way that the substrate W is cooled down to a specific temperature.

The insulating plate 270 may be provided below the lower plate 240. The insulating plate 270 may be provided to have the substantially same or similar size as the lower plate 240. The insulating plate 270 may be positioned between the lower plate 240 and the chamber 100. The insulating plate 270 may be formed of an insulating material to electrically isolate the lower plate 240 and the chamber 100 from each other.

The lower power 260 may be connected to the lower plate 240 to supply an electric power to the lower plate 240. The lower power 260 may be configured to generate an electric power with radio frequency. In some embodiments, the lower power 260 may be grounded.

The focus ring 280 may be provided at an edge region of the electrostatic chuck 200. The focus ring 280 may be shaped like a ring and may be provided along a circumference of the supporting plate 210. The focus ring 280 may include an inner part 282 and an outer part 281. The inner part 282 may be position at an inner region of the focus ring 280. The inner part 282 may be provided to have a top surface lower than that of the outer part 281. In some embodiments, the inner part 282 may be provided to have a top surface coplanar with that of the supporting plate 210. The inner part 282 may support the edge region of the substrate W located outside the supporting plate 210. The outer part 281 may be positioned outside the inner part 282. The outer part 281 may be provided to face a side portion of the substrate W loaded on the supporting plate 210. The outer part 281 may be provided to enclose the edge region of the substrate W.

The gas supplying unit 300 may include main nozzles 310 and 320 and an auxiliary nozzle 330.

The main nozzles 310 and 320 may supply gas into the processing space. The gas supplying unit 300 may include a plurality of main nozzles 310 and 320. The main nozzles 310 and 320 may be provided through a wall of the chamber 100. As an example, the main nozzles 310 and 320 may be provided through top and side walls, respectively, of the chamber 100. In some embodiments, the main nozzle may include an upper nozzle 310 and a side nozzle 320. The upper nozzle 310 may be provided through the top wall of the chamber 100. The upper nozzle 310 may be positioned on a center of the substrate. The upper nozzle 310 may supply gas onto the substrate. The upper nozzle 310 may be configured to have at least one ejection hole 311. The ejection hole 311 may supply a process gas to a center region of an excitation space IS. The upper nozzle 310 may be supported by a nozzle supporting rod (not shown) and may be positioned through the window 120.

The side nozzle 320 may be provided to surround the excitation space IS and may be shaped like a ring. The side nozzle 320 may be provided through the sidewall of the chamber 100. The side nozzle 320 may be configured to have at least one ejection hole 321. The ejection hole 321 may be inclined toward the supporting unit 200. The side nozzle 320 may supply gas to an edge region of the excitation space IS.

A main gas storage 360 may be configured to store the process gas. The process gas stored in the main gas storage 360 may be supplied to the upper nozzle 310 and the side nozzle 320. A main gas supplying line 361 may be provided to connect the main gas storage 360 to the upper and side nozzles 310 and 320. The main gas supplying line 361 may supply the process gas stored in the main gas storage 360 to the upper nozzle 310 and the side nozzle 320. A valve 362 may be provided on the main gas supplying line 361. The valve 362 may be used to control a flow rate of the process gas passing through the main gas supplying line 361.

The auxiliary nozzle 330 may be provided through an inner liner 510 to be described below. The auxiliary nozzle 330 may be provided to define an ejection hole 332 of the inner liner 510. In some embodiments, a plurality of ejection holes 332 may be disposed along a circumference of the inner liner 510. The auxiliary nozzle 330 may include a vertical conduit 331 and the ejection hole 332. The vertical conduit 331 may extend in a vertical direction from bottom to top of the inner liner 510. An end of the vertical conduit 331 may be connected to the ejection hole 332. The ejection hole 332 may extend in a direction from the vertical conduit 331 toward the supporting unit 200. The ejection hole 332 may be configured to eject the supplied gas toward the edge region of the substrate. In certain embodiments, the auxiliary nozzle 330 may be provided to have a structure coupled to the inner liner 510.

In some embodiments, the auxiliary nozzle 330 of the inner liner 510 may be configured to supply a process gas and a cleaning gas. In other example embodiments, the auxiliary nozzle 330 of the inner liner 510 may be configured to supply the process gas to the edge region of the substrate. In still other example embodiments, the auxiliary nozzle 330 of the inner liner 510 may be configured to directly supply the cleaning gas into a space between the focus ring 280 and the supporting plate 210. In even other example embodiments, the auxiliary nozzle 330 of the inner liner 510 may be configured to supply the process or cleaning gas in a direction parallel to the top surface of the supporting plate 210.

An auxiliary process gas storage 373 may be provided to store a process gas. The auxiliary process gas line 371 may be provided to connect the auxiliary process gas storage 373 to the auxiliary nozzle 330. The process gas may be supplied to the auxiliary nozzle 330 through the auxiliary process gas line 371. A valve 375 may be provided on the auxiliary process gas line 371. The valve 375 may be used to control a flow rate of the process gas passing through the auxiliary process gas line 371.

An auxiliary cleaning gas storage 374 may be provided to store a cleaning gas. An auxiliary cleaning gas line 372 may be provided to connect the auxiliary cleaning gas storage 374 to the auxiliary nozzle 330. The auxiliary cleaning gas line 372 may be used to supply cleaning gas in the auxiliary cleaning gas storage 374 to the auxiliary nozzle 330. The auxiliary nozzle 330 may be provided to supply the cleaning gas into a space between the focus ring 280 and the supporting plate 210. A valve 376 may be provided on the auxiliary cleaning gas line 372. The valve 376 may be used to control a flow rate of the cleaning gas passing through the auxiliary cleaning gas line 372. As an example, the cleaning gas may contain an inactive or inert gas (e.g., nitrogen gas or argon gas).

The plasma source unit 400 may be configured to transform the process gas, which is supplied in the chamber 100, into plasma. In some embodiments, the plasma source unit 400 may include an inductively-coupled-plasma (ICP) source. For example, the plasma source unit 400 may include an antenna room 410, an antenna 420, and a plasma power 430. The antenna room 410 may be provided to have a bottom-open cylindrical structure. The antenna room 410 may be provided to have an empty space. The antenna room 410 may be provided to have a diameter corresponding to that of the chamber 100. The antenna room 410 may have a bottom structure allowing the antenna room 410 to be attached to or detached from the window 120. The antenna 420 may be provided in the antenna room 410. The antenna 420 may be provided to have a spiral or coil structure with a plurality of windings and may be coupled to the plasma power 430. The antenna 420 may be supplied with an electric power provided from the plasma power 430. The plasma power 430 may be positioned outside the chamber 100. In the case where the electric power is applied to the antenna 420, an electromagnetic field may be generated in the processing space of the chamber 100. The process gas may be excited into a plasma state by the electromagnetic field.

The liner unit 500 may be configured to supply gas onto the top surface of the substrate. In some embodiments, the liner unit 500 may be configured to supply the process and/or cleaning gas into the processing space and to exhaust by-products, which may be produced during a substrate treating process, to an exhausting hole. The liner unit 500 may further include an outer liner 130, an actuator 550, and a controller 570, in addition to the inner liner 510.

The outer liner 130 may be provided in the body 110. The outer liner 130 may be provided to have a space with open top and bottom. The outer liner 130 may be provided to have a cylindrical shape. The outer liner 130 may have a radius, which may correspond or equal to that of an inner space of the body 110. The outer liner 130 may be provided along an inner side wall of the body 110. The outer liner 130 may include a supporting ring 131, which is provided on the body 110 and is extended from a top surface of the body 110 toward the outside. The supporting ring 131 may be provided in the form of a ring-shaped plate and may protrude outward from an outer circumference of the outer liner 130. The supporting ring 131 may be disposed on the body 110 and may be supported by the outer liner 130. The outer liner 130 may be formed of the same material as the body 110. The outer liner 130 may be formed of an aluminum-containing material. The outer liner 130 may protect the inner side wall of the body 110. During excitation of a process gas, arc discharge may occur in the chamber 100. Such an arc discharge may lead to damage of the chamber 100. However, according to example embodiments of the inventive concept, the outer liner 130 provided on the inner side surface of the body 110 may make it possible to prevent the inner side surface of the body 110 from being damaged by the arc discharge.

The inner liner 510 may be provided to enclose the supporting unit 200. The inner liner 510 may be provided in the form of a ring. The auxiliary nozzle 330 may be provided through the inner liner 510. A plurality of penetration holes 511 may be formed in the inner liner 510 to connect an internal space of the inner liner 510 to an outer space along a circumference of the inner liner 510. The plurality of penetration holes 511 may be formed below the auxiliary nozzle 330. The penetration holes 511 may be perpendicular to a circumferential surface of the inner liner 510 and may be provided to form a plurality of columns parallel to each other. The by-products produced during a substrate treating process may be exhausted through the penetration holes 511.

The actuator 550 may be connected to the inner liner 510. The actuator 550 may allow the inner liner 510 to be moved in a vertical direction.

The controller 570 may control the actuator 550. For example, the controller 570 may control the actuator 550 in such a way that a vertical level of the inner liner 510 is changed depending on a state of the substrate treating process.

As an example, in a processing step A, a process gas for treating a substrate may be supplied into the chamber 100, and the controller 570 may control the actuator 550 in such a way that, in the processing step A, the inner liner 510 is positioned at a first position R1. In a cleaning step B, a cleaning gas may be supplied to remove by-products from a space between the supporting plate 210 and the focus ring 280, and the controller 570 may control the actuator 550 in such a way that, in the cleaning step B, the inner liner 510 is positioned at a third position R3. In a waiting step C, a substrate may wait for loading in the chamber 100, and the controller 570 may control the actuator 550 in such a way that, in the waiting step C, the inner liner 510 is positioned at a second position R2. Here, the first position R1 may be higher than a top surface of the supporting unit 200 in a vertical level. The second position R2 may be lower than the top surface of the supporting unit 200 in the vertical level. The third position R3 may be higher than the top surface of the supporting unit 200 in the vertical level.

The first position R1 may be higher than the second position R2 and the third position R3. The second position R2 may be lower than the third position R3. The third position R3 may be lower than the first position R1 and higher than the second position R2.

Since the auxiliary nozzle 330 is provided in the inner liner 510, it is possible to effectively supply a process gas to an edge region of a substrate and thereby to reduce an amount of the process gas to be lost. Furthermore, since the penetration hole 511 is provided in the inner liner 510, it is possible to exhaust by-products, which may be produced in the substrate treating process, to the outside, and thereby to improve process efficiency of the substrate treating process.

The baffle unit 600 may be positioned between the inner sidewall of the body 110 and the supporting unit 200. The baffle may be provided in the form of a circular ring. A plurality of penetration holes may be provided through the baffle. The process gas supplied into the body 110 may be exhausted to the exhausting hole 102 through the penetration holes of the baffle unit 600. The flow of the process gas may be controlled depending on shapes of the baffle unit 600 and the penetration holes.

Figure 5:
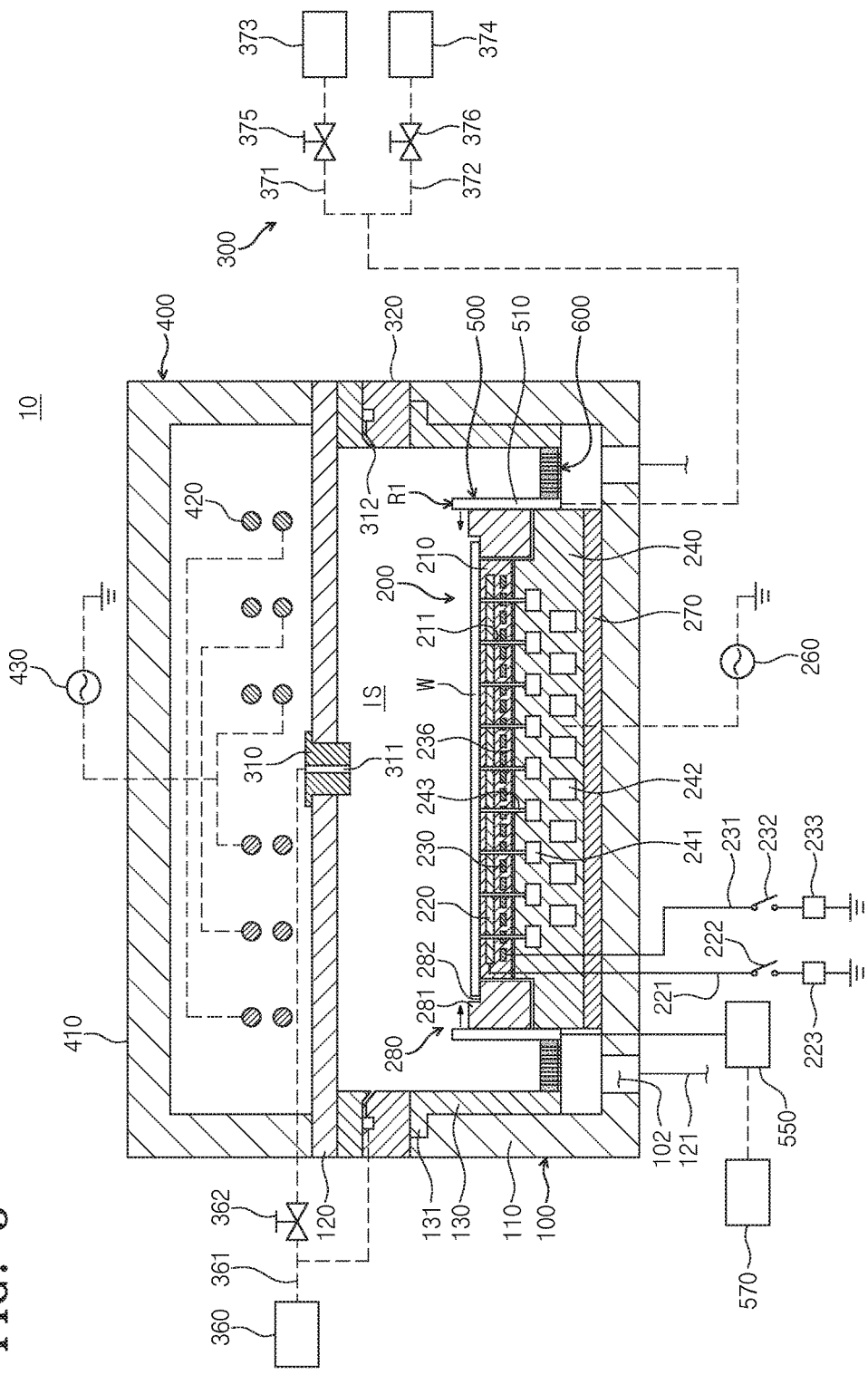
FIGS. 5 through 7 are sectional views exemplarily illustrating a change in position of an inner liner, when a substrate treating process is performed.
Figure 6:
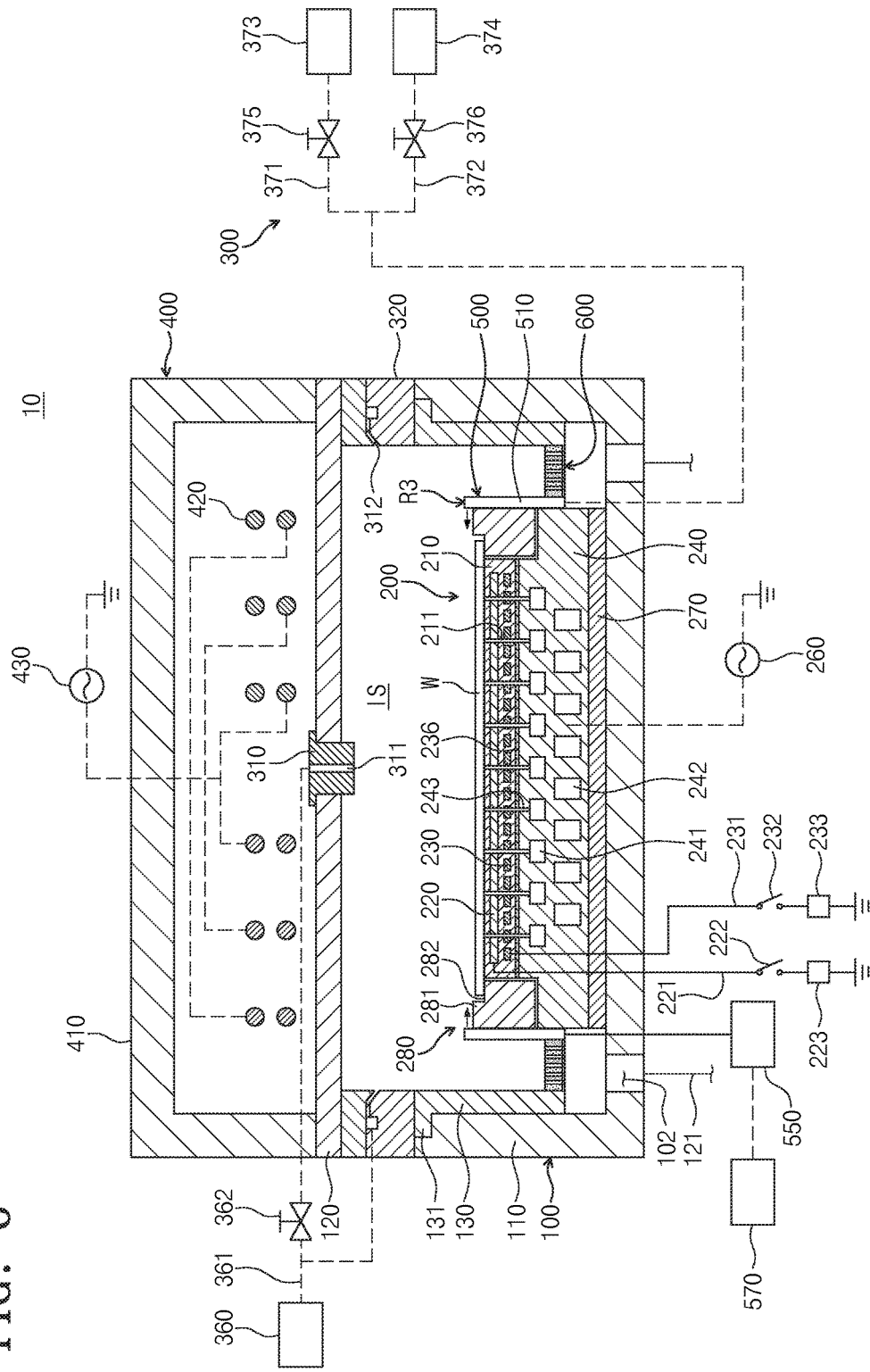
Figure 7:
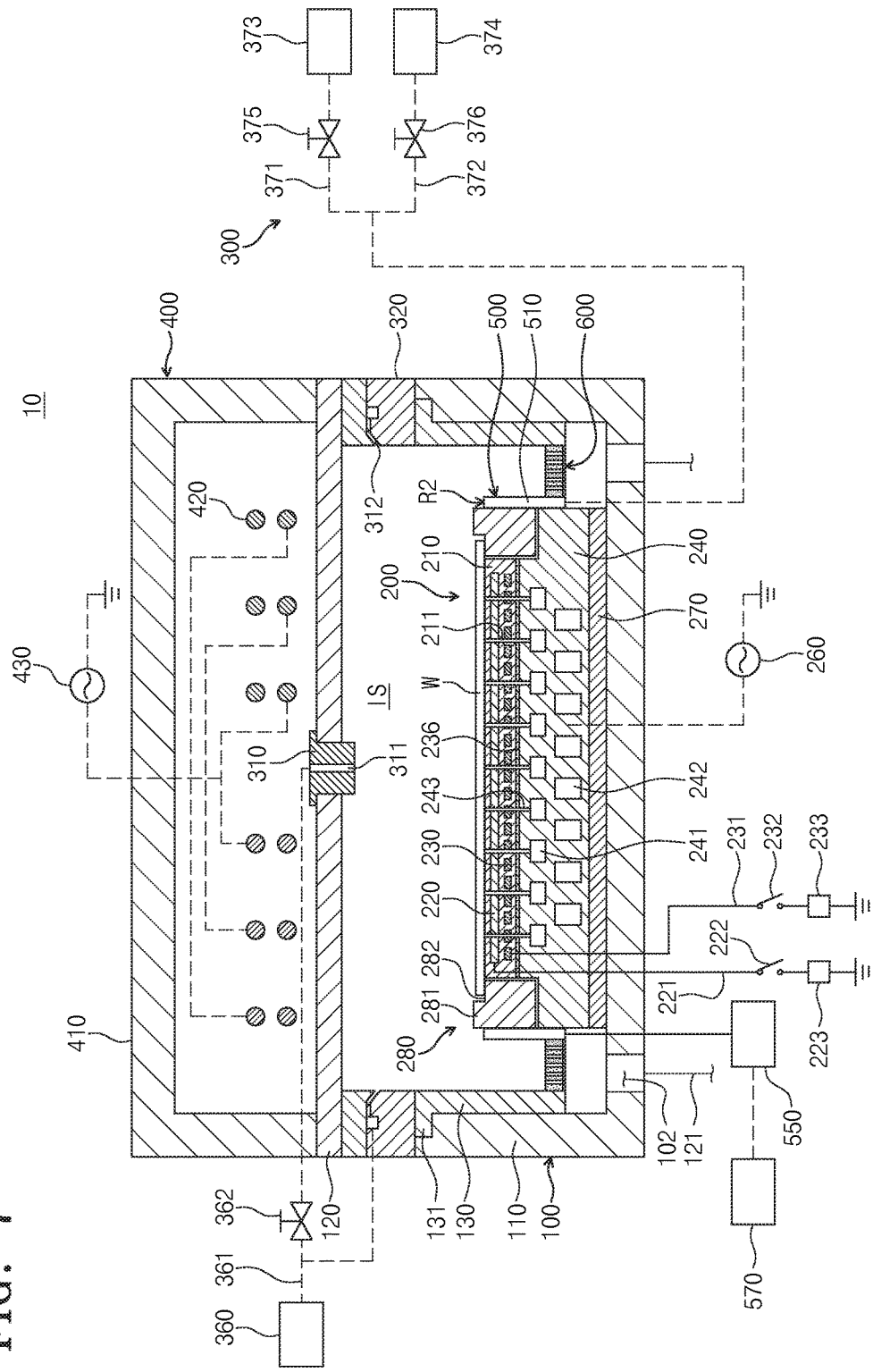
Figure 8:
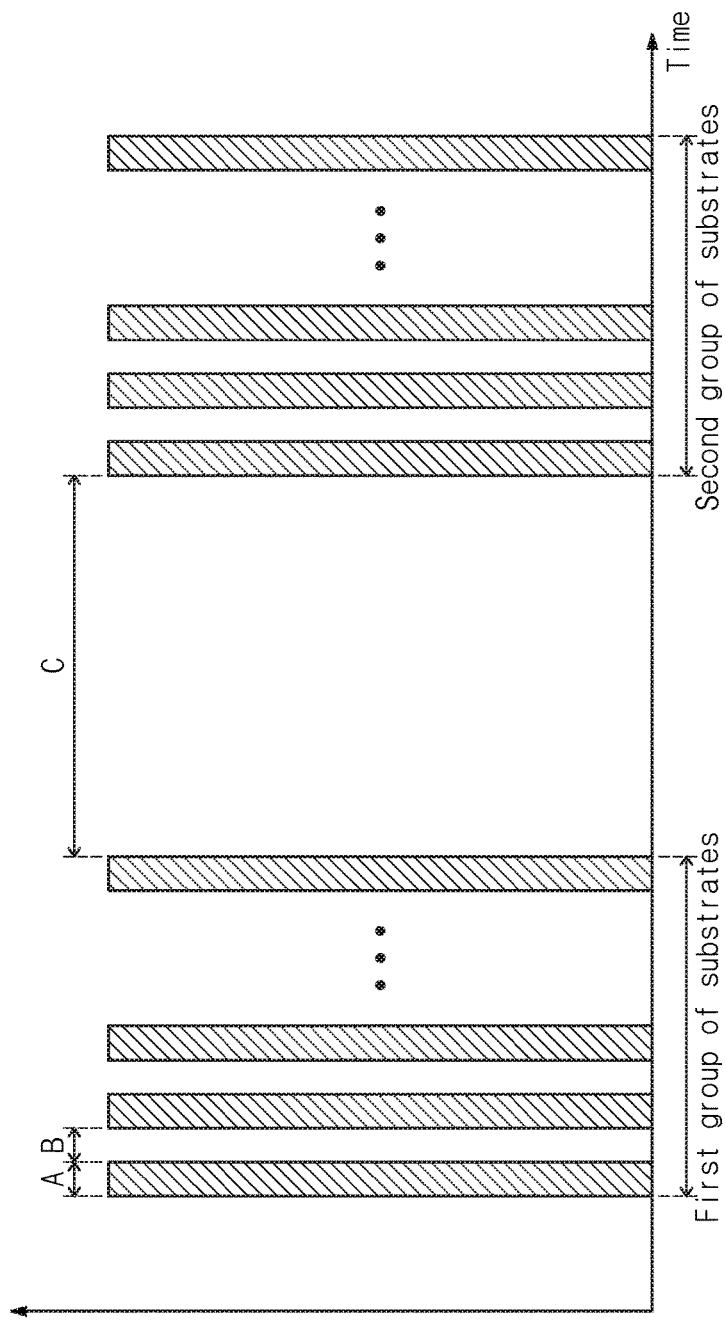
FIG. 8 is a table schematically illustrating a substrate treating method according to example embodiments of the inventive concept.

FIGS. 5 through 7 are sectional views exemplarily illustrating a change in position of an inner liner, when a substrate treating process is performed, and FIG. 8 is a table schematically illustrating a substrate treating method according to example embodiments of the inventive concept. Hereinafter, an example of a substrate treating process will be described with reference to FIGS. 5 through 8. As an example, substrates may include first and second groups of substrates, and the substrate treating process may be sequentially performed on the first and second groups.

The substrate treating process may include a processing step A, a cleaning step B, and a waiting step C.

In the processing step A, a process gas may be supplied into the processing space of the chamber 100 (or onto a substrate loaded on the supporting plate 210) to process the substrate. In the processing step A, the process gas may be supplied through the auxiliary nozzle 330 of the inner liner 510. In the processing step A, the inner liner 510 may be positioned at a first position R1. Here, the first position R1 may be higher than that of the substrate loaded on the supporting plate 210. When the inner liner 510 is positioned at the first position R1, the penetration hole 511 may be positioned at a level higher than a top surface of the substrate loaded on the supporting plate 210. In the case where the inner liner 510 is positioned at the first position R1 in the processing step A, it is possible to increase a gas density on the edge region of the substrate and thereby to improve efficiency of the substrate treating process. In the case where by-products are produced in the substrate-treating process, they may be exhausted to the outside through the penetration hole 511 of the inner liner 510.

The cleaning step B may be performed after the processing step A. The cleaning step B may be performed after performing the processing step A on one of the substrates of the first group and before performing the processing step A on another of the substrates of the first group. The cleaning step B may be performed to remove the by-products from a space between the focus ring 280 and the supporting plate 210. In the cleaning step B, the inner liner 510 may be positioned at a third position R3. The third position R3 may be higher than that of the top surface of the substrate loaded on the supporting plate 210. The third position R3 may be lower than the first position R1 in a vertical level. In the cleaning step B, a cleaning gas may be supplied through the auxiliary nozzle 330 of the inner liner 510. As a result of the supply of the cleaning gas, the by-products may be removed from the space between the focus ring 280 and the supporting plate 210, and this may make it possible to improve process efficiency in a subsequent processing step A. If the cleaning step B of a substrate is finished, the substrate may be unloaded from the chamber 100, and then, the processing step A and the cleaning step B may be sequentially performed on a new substrate selected from the first group.

If the processing and cleaning steps A and B for the first group of substrates are finished, the waiting step C may be performed before the processing and cleaning steps A and B on the second group of substrates. In the waiting step C, one of the substrates of the second group may be loaded in the processing space of the chamber 100. In the waiting step C, the inner liner 510 may be positioned at a second position R2. The second position R2 may be lower than the top surface of the substrate loaded on the supporting plate 210. The second position R2 may be lower than the first position R1 and the third position R3.

Figure 9:
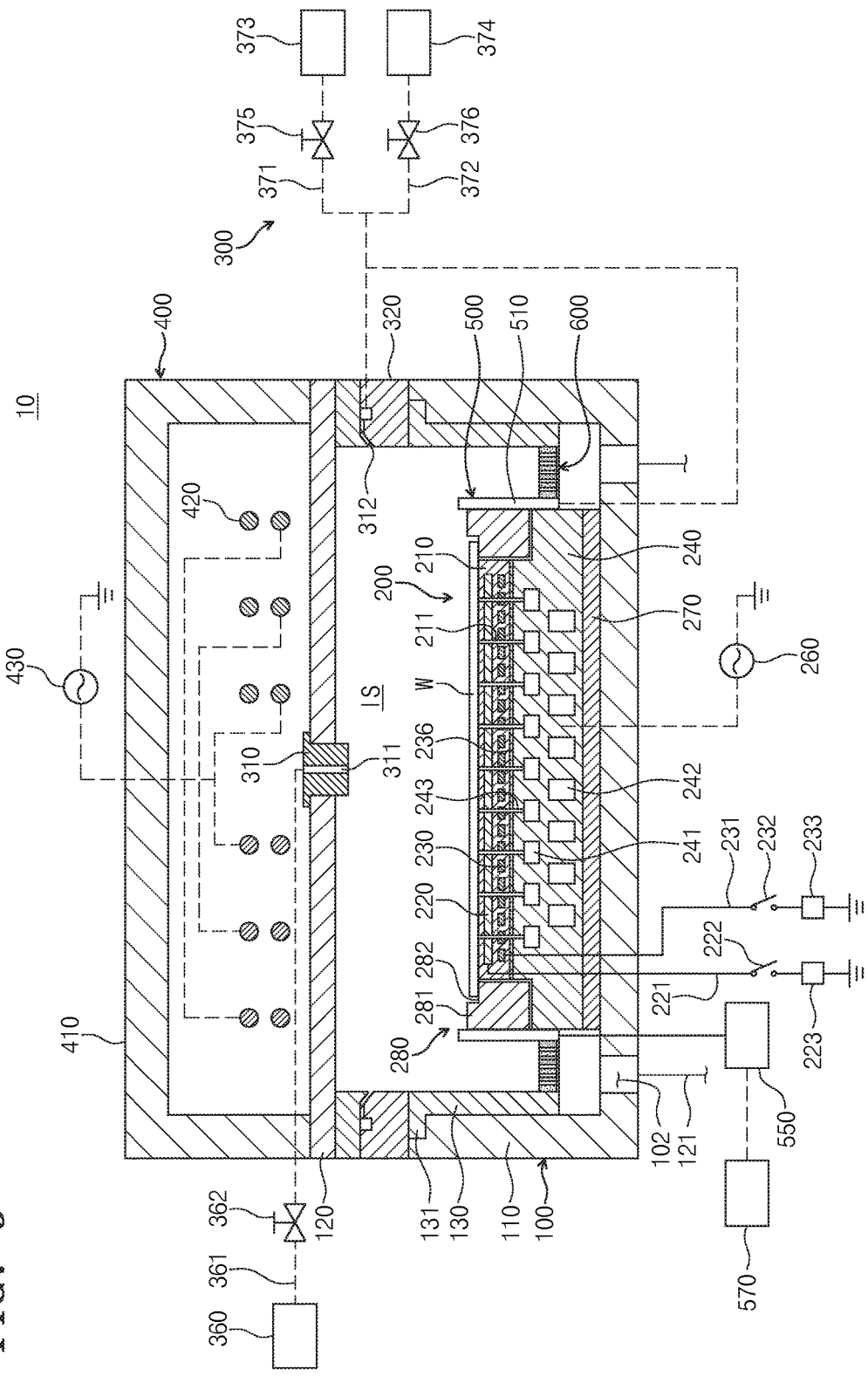
FIG. 9 is a sectional view illustrating a substrate treating system according to other example embodiments of the inventive concept.

FIG. 9 is a sectional view illustrating a substrate treating system according to other example embodiments of the inventive concept. A substrate treating system 20 may be configured to have substantially the same features as that of FIG. 1. However, in the substrate treating system 20, the auxiliary process gas line 371 and the auxiliary cleaning gas line 372 may be connected to the side nozzle 320. The process and cleaning gases, which are respectively supplied from the process and cleaning gas storages 373 and 374, may be supplied to the excitation space IS through both of the side nozzle 320 and the auxiliary nozzle 330. As an example, amounts or flow rates of the process and cleaning gases supplied through the side and auxiliary nozzles 320 and 330 may be substantially the same. Alternatively, the amounts or flow rates of the process and cleaning gases supplied through the side and auxiliary nozzles 320 and 330 may be different from each other.

Unlike the afore-described example, the main nozzle and the auxiliary nozzle may be configured to supply both of the process and cleaning gases.

In addition, according to example embodiments of the inventive concept, the supporting unit may be an electrostatic chuck, but in other example embodiments, the supporting unit may have one of various structures capable of supporting a substrate. For example, the supporting unit may be a vacuum chuck fastening a substrate using a vacuum pressure.

In the afore-described example, a plasma etching process has been described as an example of a substrate treating process, but example embodiments of the inventive concept are not limited thereto. For example, the substrate treating process may be one of various other plasma processes (e.g., deposition, ashing, and cleaning processes).

In the afore-described example, the ICP source has been described as an example of the plasma generator (e.g., the plasma source unit), but various other plasma systems (e.g., a capacitively-coupled plasma (CCP) or electron cyclotron resonance (ECR) plasma source), may be used as the plasma generator.

According to example embodiments of the inventive concept, an auxiliary nozzle may be provided through an inner liner, and this may make it possible to improve process efficiency of a substrate treating system.

According to other example embodiments of the inventive concept, the auxiliary nozzle may be used to supply a process gas into a process chamber, and this may make it possible to reduce loss of the supplied process gas.

According to still other example embodiments of the inventive concept, the auxiliary nozzle may be configured to supply the process gas onto an edge region of a substrate, and this may make it possible to uniformly supply the process gas onto the substrate without spatial variation in amount of the process gas supplied on the substrate.

According to even other example embodiments of the inventive concept, the auxiliary nozzle may be used to supply a cleaning gas for removing by-products from a space between a supporting plate and a focus ring, and this may make it possible to further improve process efficiency of the substrate treating process.

While example embodiments of the inventive concepts have been particularly shown and described, it will be understood by one of ordinary skill in the art that variations in form and detail may be made therein without departing from the spirit and scope of the attached claims.

What is claimed is:

1. A method of treating a substrate, comprising:
    a processing step of supplying a process gas into a processing space of a chamber to treat a substrate loaded on a supporting plate;
    a waiting step of waiting for loading of the substrate in the processing space of the chamber; and
    a cleaning step for removing by-products from a space between a focus ring enclosing the supporting plate and the supporting plate, between the processing step and the waiting step,
    wherein an inner liner provided to enclose the supporting plate is positioned at a first position in the processing step and at a second position lower than the first position in the waiting step, and
    the inner liner is positioned at a third position lower than the first position and higher than the second position in the cleaning step.

2. The method of claim 1, wherein the processing step includes supplying the process gas to a main nozzle provided through a wall of the chamber, and to an auxiliary nozzle provided through the inner liner.

3. The method of claim 2, wherein in the processing step, an amount of the process gas supplied to the main nozzle is the same as an amount of the process gas supplied to the auxiliary nozzle.

4. The method of claim 1, wherein in the cleaning step, a cleaning gas is supplied to an auxiliary nozzle provided through the inner liner.

5. The method of claim 1, wherein the first position is higher than a top surface of the substrate loaded on the supporting plate.

6. The method of claim 1, wherein the second position is lower than a top surface of the substrate loaded on the supporting plate.

7. The method of claim 1, wherein the third position is higher than a top surface of the substrate loaded on the supporting plate.

8. The method of claim 1, wherein the inner liner has a circular-ring shape, and comprises a plurality of penetration holes formed through the inner liner along a circumference thereof to connect an internal space of the inner liner to an outer space, and in the first position, the penetration holes are positioned at a level higher than a top surface of the substrate loaded on the supporting plate.

\* \* \* \* \*